United States Patent
Makita

(10) Patent No.: US 6,620,636 B2
(45) Date of Patent: Sep. 16, 2003

(54) SEMICONDUCTOR MANUFACTURING METHOD AND SEMICONDUCTOR MANUFACTURING APPARATUS

(75) Inventor: Toshiyuki Makita, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/092,712

(22) Filed: Mar. 7, 2002

(65) Prior Publication Data

US 2002/0173057 A1 Nov. 21, 2002

(30) Foreign Application Priority Data

Mar. 12, 2001 (JP) ................................. P2001-069136

(51) Int. Cl.$^7$ ............................................. H01L 21/66
(52) U.S. Cl. ........................... 438/14; 204/400; 438/15; 256/48
(58) Field of Search ..................... 438/14–16; 256/48; 364/468

(56) References Cited

U.S. PATENT DOCUMENTS

| | | | | | |
|---|---|---|---|---|---|
| 4,775,281 A | * | 10/1988 | Prentakis | ................ | 414/416.03 |
| 5,148,100 A | * | 9/1992 | Sekiba | ................ | 324/765 |
| 5,280,983 A | * | 1/1994 | Maydan et al. | ................ | 294/119.1 |
| 5,614,837 A | * | 3/1997 | Itoyama et al. | ................ | 324/760 |
| 5,930,138 A | * | 7/1999 | Lin et al. | ................ | 700/108 |
| 5,943,551 A | * | 8/1999 | Schemmel et al. | ................ | 438/14 |
| 5,956,566 A | * | 9/1999 | Lin et al. | ................ | 438/17 |
| 5,971,586 A | * | 10/1999 | Mori | ................ | 700/108 |
| 6,121,147 A | * | 9/2000 | Daniel et al. | ................ | 438/692 |
| 6,136,614 A | * | 10/2000 | Funk | ................ | 438/5 |
| 6,203,582 B1 | * | 3/2001 | Berner et al. | ................ | 29/25.01 |
| 6,242,270 B1 | * | 6/2001 | Nagaswami et al. | ................ | 438/14 |
| 6,255,727 B1 | * | 7/2001 | Khoury | ................ | 257/693 |
| 6,274,395 B1 | * | 8/2001 | Weber | ................ | 438/14 |
| 6,303,398 B1 | * | 10/2001 | Goerigk | ................ | 438/14 |
| 6,340,838 B1 | * | 1/2002 | Chung et al. | ................ | 257/668 |
| 6,437,423 B1 | * | 8/2002 | Akram | ................ | 257/624 |

* cited by examiner

Primary Examiner—John F. Niebling
Assistant Examiner—Olivia Luk
(74) Attorney, Agent, or Firm—Sonnenschein, Nath & Rosenthal LLP

(57) ABSTRACT

Inspection of a semiconductor wafer is performed while a manufacturing process of another semiconductor wafer is executed. A plurality of semiconductor wafers are mounted on a semiconductor manufacturing apparatus and, while semiconductor the manufacturing process is executed, an arbitrary semiconductor wafer is removed from among the semiconductor wafers having finished the manufacturing process, to a position that is different from a position on the manufacturing apparatus defined for the plurality of semiconductor wafers. Inspection is then done for the removed wafer and, if it is evaluated as good, it is first returned to the position from which the wafer has been removed and then returned, along with the other semiconductor wafers to the original position on the manufacturing apparatus.

10 Claims, 3 Drawing Sheets

SEMICONDUCTOR MANUFACTURING METHOD AND SEMICONDUCTOR MANUFACTURING APPARATUS

CROSS REFERENCE TO RELATED APPLICATIONS

This application claims priority to Japanese Patent Application No. JP 2001-069136, filed on Mar. 12, 2001, and the disclosure of such application is herein incorporated by reference to the extent permitted by law.

BACKGROUND OF THE INVENTION

1. Field of the Invention

The present invention is related to a semiconductor manufacturing method and apparatus. Particularly, the present invention is related to an apparatus and method for forming a semiconductor circuit over a semiconductor wafer while executing a semiconductor manufacturing process of the semiconductor wafer.

2. Related Art

Conventionally, a semiconductor circuit is manufactured by slicing a semiconductor wafer as individual chips. Such semiconductor wafer would have a plurality of circuit patterns of identical shape formed thereon by utilizing thin film technology such as vapor deposition technology, sputtering, etc.

An example of conventional semiconductor manufacturing apparatus performing such process is shown in FIG. 3.

A semiconductor manufacturing apparatus 100 includes wafer mounting sections 102a and 102b having containers 101a and 101b for containing semiconductor wafers, process chambers 103a and 103b for performing manufacturing process of the semiconductor wafer, and a conveying section 104 for conveying the semiconductor wafer between the wafer mounting sections and the process chambers.

The wafer mounting sections 102a and 102b are provided with hermetic containers 101a and 101b having a configuration in which a plurality of semiconductor wafer can be mounted therein, therefore permitting conveying the wafers without exposing them to external environment.

The process chambers 103a and 103b may include semiconductor processes such as: forming semiconductor circuit patterns over the semiconductor wafer by means of vapor deposition, sputtering or other thin film forming technologies; forming resist patterns corresponding to the semiconductor circuit pattern; etching the semiconductor wafer having the resist pattern formed thereon, etc.

The wafer conveying section 104 has a conveying robot 105 for conveying the semiconductor wafers between the wafer mounting sections (102a and 102b) and the process chambers (103a and 103b).

In such semiconductor manufacturing apparatus 100, the containers 101a and 101b containing semiconductor wafers are mounted on the wafer mounting section 102a and 102b, the semiconductor wafers are taken out of the containers 101a and 101b by the conveying robot 105 of the wafer conveying section 104 and transferred to the processing chambers 103a and 103b, passing through the wafer conveying 104. In addition, the semiconductor manufacturing processes are performed against the semiconductor wafers supplied to the processing chamber 103a and 103b.

As a result, it is possible to form a plurality of semiconductor circuit patterns of identical or similar configuration over the semiconductor wafer and, by slicing the semiconductor wafer after forming the plurality of semiconductor circuit patterns as individual semiconductor chips, it is possible to manufacture a plurality of semiconductor circuits as a lot.

In the semiconductor manufacturing apparatus 100 mentioned above, the semiconductor wafer is inspected upon being transferred to an inspection apparatus, in order to assuring quality and yield rate, after the semiconductor manufacturing process is finished. In addition, before executing an actual production of the semiconductor, the conditions of the process are verified with one up to a few pieces of semiconductor wafers previously processed.

However, there is a drawback in the semiconductor manufacturing apparatus in which the manufacturing time is relatively extensive, as the semiconductor wafer cannot be transferred to the inspection apparatus unless the semiconductor manufacturing process are performed for all semiconductor wafers contained within the above-mentioned containers 101a and 101b.

This is particularly critical for sampling inspection, as a few pieces of semiconductor wafer have to be taken out randomly from the containers 101a and 101b and such sampling can be done only after the manufacturing process is completed for all semiconductor wafers in the containers. Thus, such configuration constitutes a limiting factor for the productivity of the process.

In view of such problems, it has been conventional practice to have the inspection apparatus in line, i.e., to introduce the inspection apparatus along with the semiconductor manufacturing apparatus in the manufacturing system, or to establish monitoring by introducing an inspection unit in the semiconductor manufacturing apparatus itself.

Nevertheless, having the inspection apparatus in line is not cost-effective, when considering that the inspection process easily receives influence from external factors such as vibration and the inspection is performed by sampling of only a few pieces, thus performance of the process is compromised. On the other hand, the monitoring has not yet achieved a level of technological development enough to perform inspection of a production in large scale.

Moreover, there are many processes in the inspection of a semiconductor wafer that still required visual check by an inspector, such as verification of a surface of the wafer, thus it is still common practice to execute inspection after semiconductor manufacturing processes of all semiconductor wafers are finished.

SUMMARY OF THE INVENTION

The present invention has been conceived in view of the above-mentioned situation of the prior art. It is preferable according to the present invention, to provide a semiconductor manufacturing method and a semiconductor manufacturing apparatus that allows reduction of production time and improvement of quality and yield rate by permitting realizing inspection of a semiconductor wafer while executing the semiconductor manufacturing process.

According to a preferred embodiment of the present invention, there is provided a semiconductor manufacturing method for forming a semiconductor circuit on a semiconductor wafer while performing semiconductor manufacturing process on the semiconductor wafer, such method including: mounting a plurality of the semiconductor wafers on a mounting position on a semiconductor manufacturing apparatus; removing a semiconductor wafer among the plurality of semiconductor wafers from a position different from the mounting position of the semiconductor manufacturing apparatus while a semiconductor manufacturing process is performed for each of the plurality of semiconductor wafers, the removed semiconductor wafer being a semiconductor wafer to which the semiconductor manufacturing process is finished; inspecting the removed semiconductor wafer; returning the removed semiconductor wafer to the position different from the mounting position on the semiconductor manufacturing apparatus, if the removed semiconductor wafer is evaluated as good in the inspecting step; returning the removed semiconductor wafer to the mounting position on the semiconductor manufacturing apparatus, together with other semiconductor wafers having finished the semiconductor manufacturing process.

As described above, according to the semiconductor manufacturing method of the present invention, by removing a semiconductor wafer among the plurality of semiconductor wafers to which the semiconductor manufacturing process is finished, from a position different from the mounting position of the semiconductor manufacturing apparatus, it is possible to execute the semiconductor manufacturing process for the remaining plurality of semiconductor wafers while inspection is done to the removed semiconductor wafer.

In addition, by returning the inspected semiconductor wafer from a position which is different from the mounting position of the plurality of semiconductor wafers on the semiconductor manufacturing apparatus, and then returning the semiconductor wafer along with the other semiconductor wafers to which manufacturing process has been finished, to a position on the semiconductor apparatus provided for the plurality of semiconductor wafers, it is possible to return the semiconductor wafers to their position on the semiconductor manufacturing apparatus without having influence from the inspection process of the removed semiconductor wafer.

As a result, according to the method of the present invention, it is possible to perform inspection of the semiconductor wafer while executing in parallel, the manufacturing process of the semiconductor wafers.

In addition, if the removed semiconductor wafer is evaluated as defective in the inspection process, the semiconductor manufacturing apparatus is immediately stopped. As a result, it is possible to restrain occurrence of defective products.

According to another preferred embodiment of the present invention, there is provided a semiconductor manufacturing apparatus for forming a semiconductor circuit on a semiconductor wafer while performing semiconductor manufacturing process on the semiconductor wafer, such apparatus including: a wafer mounting section for mounting a plurality of the semiconductor wafers; a process chamber for performing a semiconductor manufacturing process of the semiconductor wafer; a wafer service section for removing and/or setting the semiconductor wafer; a wafer conveying section for conveying the semiconductor wafer between the mounting section, the process chamber and the wafer service section. An arbitrary semiconductor wafer among semiconductor wafers having finished the semiconductor manufacturing process in the process chamber is removed from the wafer service section, and the arbitrary wafer is returned to the wafer mounting section together with other semiconductor wafers having finished the semiconductor manufacturing process, after the arbitrary semiconductor wafer is returned to the wafer service section.

As described above, according to the semiconductor manufacturing apparatus of the present invention, by removing a semiconductor wafer among the plurality of semiconductor wafers to which the semiconductor manufacturing process is finished, it is possible to execute the semiconductor manufacturing process for the remaining plurality of semiconductor wafers while inspection is done to the removed semiconductor wafer.

In addition, by returning the inspected semiconductor wafer from the wafer service section (wafer server), the semiconductor wafer is returned to the wafer mounting section along with the other semiconductor wafers to which manufacturing process has been finished. As a result, it is possible to return the semiconductor wafers to their mounting position on the semiconductor manufacturing apparatus without having influence from the inspection process of the removed semiconductor wafer.

As a result, according to the semiconductor manufacturing apparatus of the present invention, it is possible to place or remove an arbitrary semiconductor wafer from the wafer service section while executing in parallel the manufacturing process of the semiconductor wafers in the process chamber.

Also, if the removed semiconductor wafer is evaluated as defective in the inspection process, the semiconductor manufacturing apparatus is immediately stopped, thus it is possible to restrain occurrence of defective products.

As described above, according to the preferred embodiments of the present invention, it is possible to attain reduction of manufacturing time and improvement of both quality and yield rate, as it is permitted to perform inspection of the semiconductor wafers while performing the semiconductor manufacturing processes.

BRIEF DESCRIPTION OF THE DRAWINGS

The above and other objects, features and advantages of the present invention will become more apparent to those skilled in the art from the following description of the preferred exemplary embodiments of the present invention taken in conjunction with the accompanying drawings, in which.

DETAILED DESCRIPTION OF THE PREFERRED EMBODIMENTS OF THE INVENTION

Preferred embodiments of the present invention will be described below with reference to the accompanying drawings.

Figure 1:
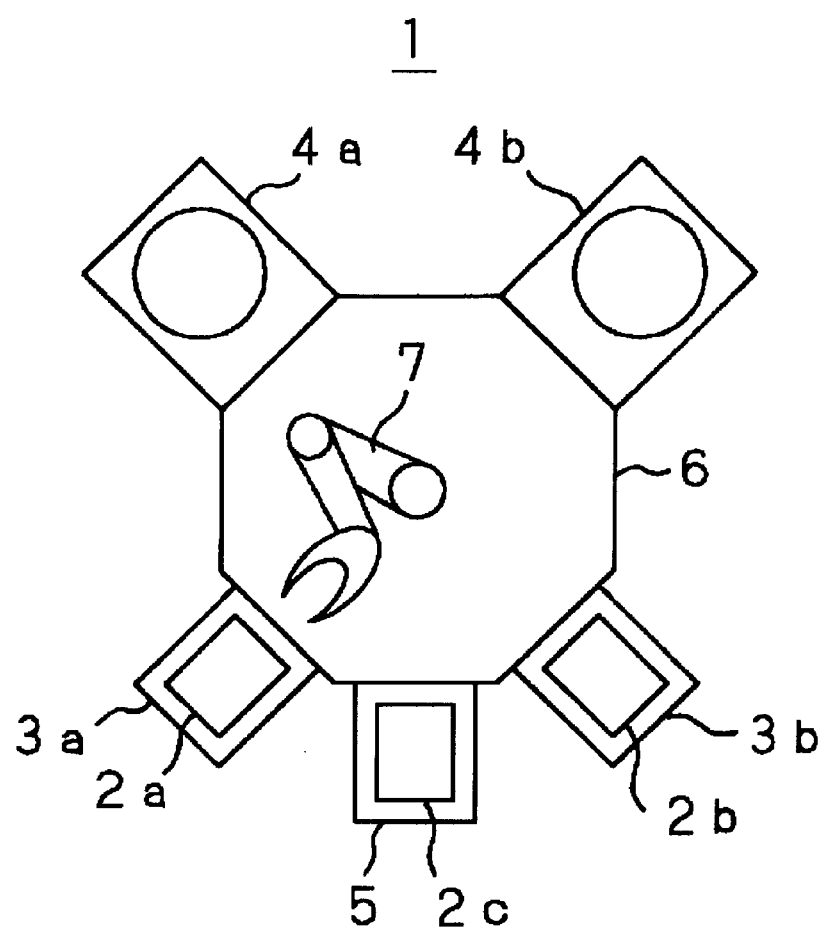
FIG. 1 is a schematic view of an example of a semiconductor manufacturing apparatus, according to a preferred embodiment of the present invention.

FIG. 1 shows a schematic view of a semiconductor manufacturing apparatus according to a preferred embodiment of the present invention.

In FIG. 1, a semiconductor manufacturing apparatus 1 executes forming of a semiconductor circuit on a semiconductor wafer while executing a semiconductor manufacturing process of the semiconductor wafer. Also, the apparatus is arranged together with a semiconductor inspection apparatus in a clean room having its internal environment isolated from external ambient atmosphere. In addition, the internal environment of such clean room is kept "clean" to a desired extent, as clean air, free of dust or determined particles, is supplied into the clean room.

In addition, the semiconductor wafer can be conveyed or transported to the semiconductor manufacturing apparatus 1 or the inspection apparatus in lots of a predetermined size (usually, approximately 25 pieces) stored in a cassette, or the entire cassette is carried in a designated hermetic container.

The semiconductor manufacturing apparatus 1 includes a first and a second wafer mounting section 3a and 3b on which a first and a second container 2a and 2b containing the above-mentioned semiconductor wafer cassettes are mounted; a first and a second process chamber 4a and 4b for processing the semiconductor wafer; a wafer server 5 for taking a semiconductor wafer in and out; and a wafer conveying section 6 for conveying the semiconductor wafer between the wafer mounting sections 3a and 3b, the first and second process chambers 4a and 4b and the wafer server 5.

The first and second wafer mounting sections 3a and 3b function as both loader and unloaders, having interfaces such as, for example, SMIF (Standard Mechanical Interface) or FOUP (Front-Opening Unified Pod), for serving semiconductor wafers carried on cassettes from inside the hermetic first and second containers 2a and 2b to the wafer conveying section 6, without making the wafers have contact with outside ambient atmosphere.

The first and second wafer process chambers 4a and 4b permit realization of semiconductor manufacturing process of the semiconductor wafer under an environment in which a desirably high vacuum is kept inside the chamber due to a vacuum pump (not shown in the figure). Specifically, processes such as forming of circuit patterns on the semiconductor wafer by utilizing thin film technology like vapor deposition, sputtering, etc., forming of a resist pattern corresponding to the circuit pattern formed on the wafer by utilizing photolithography, etching process against the semiconductor wafer having the resist pattern formed thereon, etc.

The wafer server 5 is a loader and unloader provided independently from the above mentioned first and second wafer mounting sections 3a and 3b, permitting loading/unloading to/from the semiconductor manufacturing apparatus 1, an arbitrary semiconductor wafer carried as an entire cassette on an hermetic third container 2c. Specifically, such wafer server 5 have interfaces such as, for example, SMIF or FOUP, for serving semiconductor wafers carried on cassettes, from inside the wafer conveying section 6 to the hermetic third container 2c, without making the wafers have contact with outside ambient atmosphere.

The wafer conveying section 6 includes a conveying robot 7, which conveys the semiconductor wafer between the first and second wafer mounting sections 3a and 3b, the first and second process chambers 4a and 4b and the wafer server 5.

In addition, the semiconductor manufacturing apparatus 1 includes a control section for controlling operation of the apparatus as a whole, such as controlling conveyance of a semiconductor wafer by the conveying robot 7, controlling each of the semiconductor manufacturing processes of the first and second process chambers 4a and 4b, etc.

Also, the semiconductor manufacturing apparatus 1 has an operation section for input of required operation instructions, for instance, by an operator observing a display apparatus (not shown).

A semiconductor manufacturing method according to a preferred embodiment of the present invention permits, upon utilizing the semiconductor manufacturing apparatus 1 with a construction as described above, inspection of the semiconductor wafer, verification of preliminary conditions, etc., while executing the manufacturing processes of the semiconductor wafer.

Figure 2:
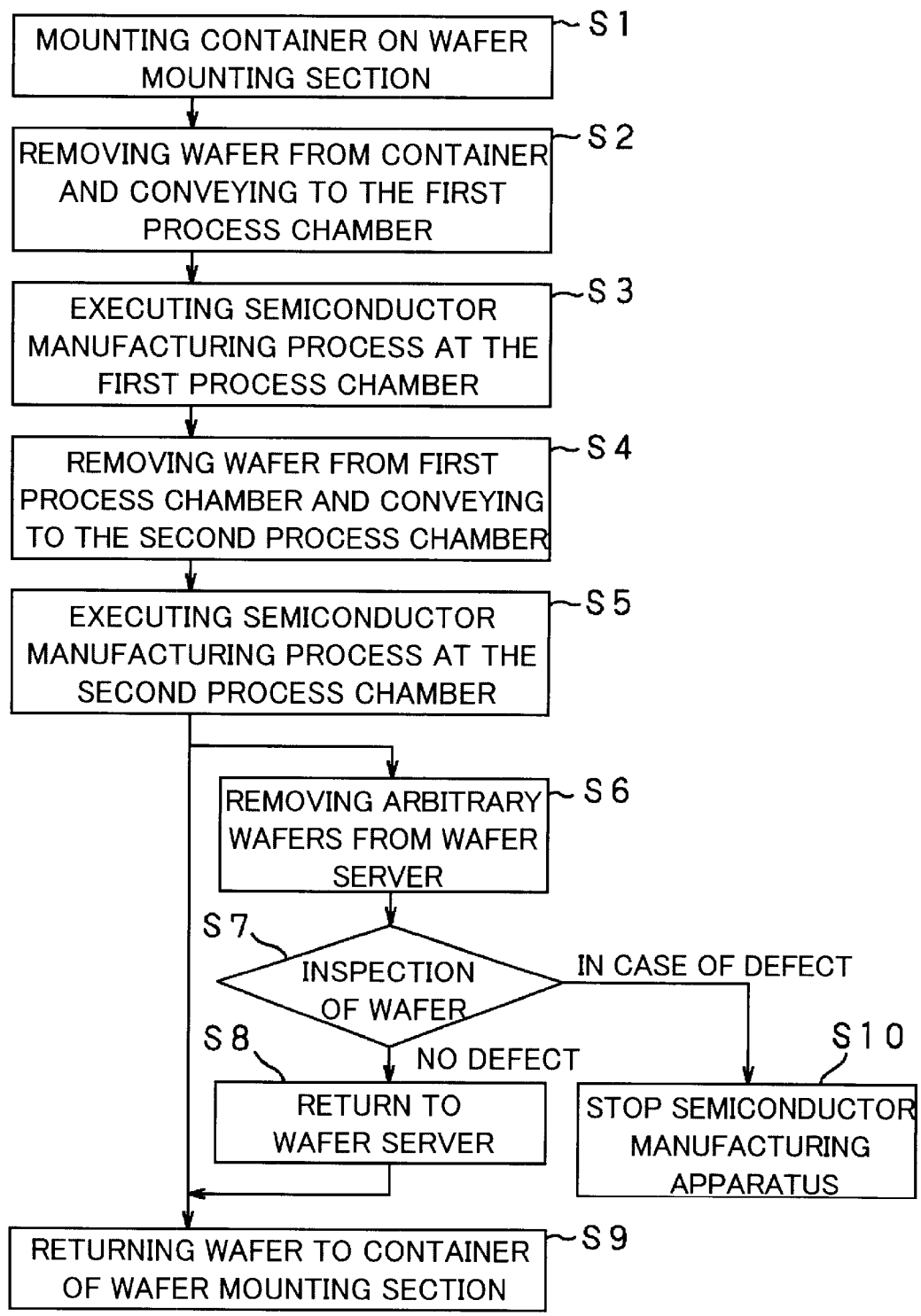
FIG. 2 is a flowchart indicating the steps of inspecting a semiconductor wafer while performing a semiconductor manufacturing process, by using the semiconductor manufacturing apparatus, according to the preferred embodiment of the present invention.
Figure 3:
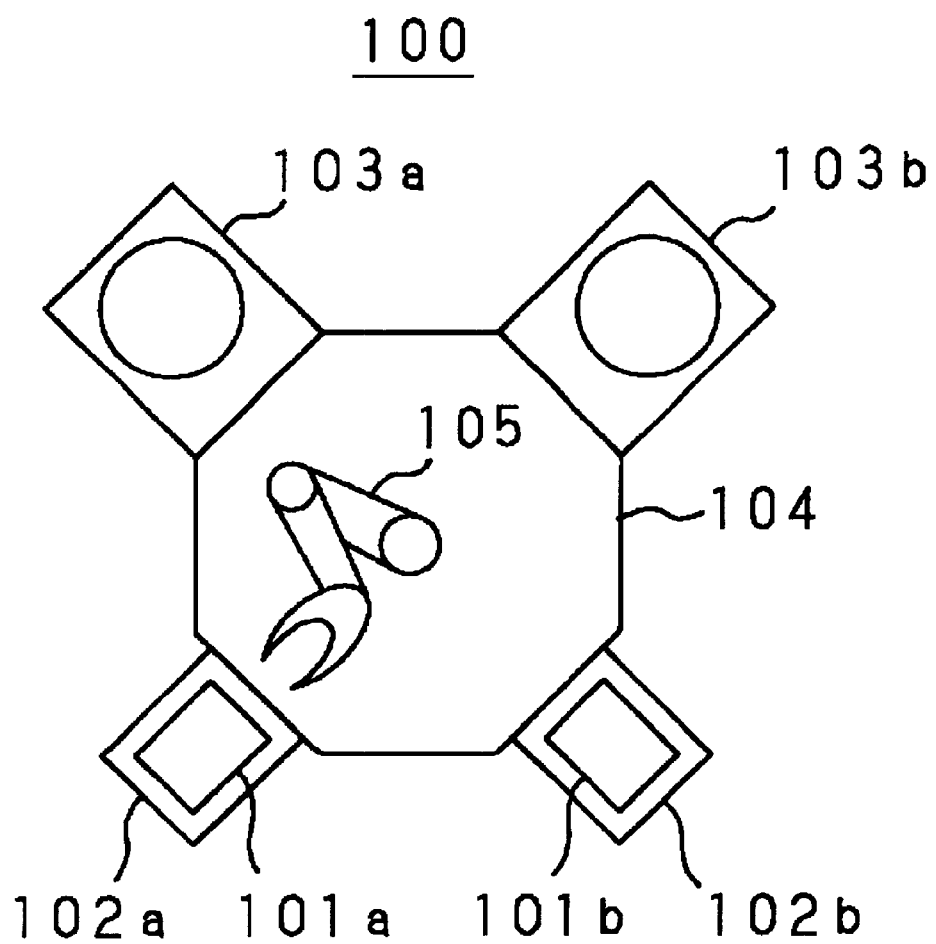
FIG. 3 is a schematic view of an example of a conventional semiconductor manufacturing apparatus.

Specifically, a procedure for inspecting a semiconductor wafer while executing a manufacturing process of the semiconductor wafer by utilizing the semiconductor manufacturing apparatus 1 will be described with reference to a flowchart shown in FIG. 2.

In step S1, the first and second containers 2a and 2b are respectively mounted on the first and second wafer mounting sections 3a and 3b of the semiconductor manufacturing apparatus 1. In addition, the semiconductor wafers are carried on cassettes containing a plurality of pieces (in the present case, 25 pieces). Such cassettes are accommodated within the first and the second containers 3a and 3b.

Next, in step S2, upon removing the cassette from a bottom portion of the first and second containers 2a and 2b mounted on the wafer mounting sections 3a and 3b, the robot arm 7 of the wafer conveying section 6 takes out a semiconductor wafer from inside the cassette and supplies the semiconductor wafer to the first process chamber 4a, passing through the wafer conveying section 6.

Next, in step S3, a semiconductor manufacturing process is performed over the semiconductor wafer supplied to the first process chamber 4a.

Then, in step S4, the robot arm 7 removes the semiconductor wafer from the first process chamber 4a and the semiconductor wafer is supplied to the second process chamber 4b, again passing through the wafer conveying section 6.

In step S5, a semiconductor manufacturing process is executed for the semiconductor wafer supplied to the second process chamber 4b.

Next, in step S6, the robot arm 7 removes from the second process chamber 4b an arbitrary semiconductor wafer from among the semiconductor wafers to which semiconductor manufacturing process has been performed (for the present example, the selected semiconductor wafers to be removed are a second and a tenth wafer of the cassette), which, after passing through the wafer conveying section 6, is conveyed to the wafer server 5. Then, the semiconductor wafer conveyed to the wafer server 5 is loaded onto a cassette by the robot arm 7 and such cassette is carried into the third container 2c mounted on the wafer server 5. Moreover, the third container 2c is removed from the wafer server 5 of the semiconductor manufacturing apparatus 1 and conveyed to an inspection apparatus.

Still, the semiconductor manufacturing apparatus 1 may include a means for notifying that the semiconductor wafer can be removed from wafer server 5, such as a buzzer or a signal tower. As a result, it is possible to notice that a semiconductor wafer has been loaded into the third container 2c, thus the third container 2c can be conveyed to the inspection apparatus.

In addition, in step S7, inspection of the sampling semiconductor wafer is performed by a Scanning Electron Microscope (SEM), for example. Specifically, inspection is performed for a plurality of items of inspection, such as superposing measurement, length SEM, visual inspection by an inspector, etc.

Moreover, if the semiconductor wafer is evaluated as good, the semiconductor wafer is returned to the cassette, which is loaded back into the third container 2c. Then, process goes further to step S8, in which the third container 2c is mounted back to the wafer server 5 of the semiconductor manufacturing apparatus 1.

Next, in step S9, upon removing a cassette from the bottom of the third container 2c mounted on the wafer server 5, the robot arm 7 of the wafer conveying section 6 removes a semiconductor wafer from the cassette and conveys the wafer to the first and second wafer mounting sections 3a and 3b, after passing through the wafer conveying section 6.

Moreover, the semiconductor wafers conveyed to the first and second wafer mounting sections 3a and 3b are loaded to a cassette by the robot arm 7, together with other semiconductor wafers to which semiconductor manufacturing processes have been performed, and the entire cassette is returned to the first and second containers 2a and 2b mounted on the first and second wafer mounting sections 3a and 3b.

Still, in the above-mentioned cassette, an identification code such as a barcode (ID number) is provided as address data for indicating a position in the cassette in which each semiconductor wafer is located. In other words, the address data provided in the cassette functions as identification data for identifying each of the semiconductor wafers. In addition, a barcode (ID number) or the like is provided to the first and second containers 2a and 2b as identification data for identifying each of the containers 2a and 2b.

Such semiconductor manufacturing apparatus 1 has in its control section a storage means (a memory or the like), for storing the above-mentioned identification data of each of the semiconductor wafers, and stores (memorizes) identification data of semiconductor wafers that have been removed from the wafer server 5 (in the present example, a second and a tenth semiconductor wafer from each cassette), while reading identification data of each of the semiconductor wafers loaded in the first and second containers 2a and 2b.

As a result, it is possible to return the semiconductor wafer to its original location in the first or second containers 2a or 2b, based on the above-mentioned semiconductor wafer identification data, even if a semiconductor manufacturing process is simultaneously processed for another semiconductor wafer removed from other first and second containers 2a and 2b.

As it can be observed from the description above, the methodology according to the preferred embodiment of the present invention permits execution of semiconductor manufacturing processes for a semiconductor in the first and second process chambers 4a and 4b, while executing inspection of other semiconductor wafers removed arbitrarily from the wafer server 5 of the semiconductor manufacturing apparatus 1.

In addition, the inspected semiconductor wafer is returned to the semiconductor manufacturing apparatus 1 from the wafer server 5 and loaded back to the first and second containers 2a and 2b mounted on the first and second wafer mounting sections 3a and 3b, together with other semiconductor wafer against which the manufacturing process has been completed.

As a result, it is possible to return all semiconductor wafers having the manufacturing process completed to the first and second containers 2a and 2b, without having influence from the inspection of the semiconductor wafer.

Accordingly, the methodology presented herein according to the preferred embodiment of the present invention allows realization of reduction of production time, as inspection of the semiconductor wafer is performed in parallel with the manufacturing process of the semiconductor wafer.

Also, in step S5 mentioned above, if the semiconductor wafer is evaluated as defective, the processing goes to step S10, in which the semiconductor manufacturing apparatus is stopped. By doing so, it is possible to restrain the generation of defects in the semiconductor manufacturing apparatus, thus promoting improvement of quality and yield rate of the manufacturing process.

Through the semiconductor manufacturing apparatus 1 according to the preferred embodiment of the present invention as described above, it is possible to form a plurality of similar semiconductor circuit patterns on the semiconductor wafer. In addition, a plurality of semiconductor circuits are produced in a lot by slicing as individual semiconductor chips, the semiconductor wafer having the semiconductor circuit patterns formed thereon, in a subsequent cutting or slicing process.

Furthermore, the present invention is not limited or restricted to the preferred embodiment of the semiconductor manufacturing apparatus as described above, so that it can be applied to other apparatuses such as a coating apparatus, a development apparatus or the like performing lithographic process, etc. Moreover, the coating, developing apparatus or the like includes four loaders and unloaders, so that, by utilizing one of the loaders and unloaders as the wafer server (5) as described above, it is possible to execute inspection in parallel to the lithography process, without having to perform substantial modification of the apparatus. As a result, it is possible to achieve reduction of manufacturing time.

Finally, the configurations and structures of respective units and portions described specifically with respect to the preferred embodiments of the present invention are only examples of realization of the present invention, so the embodiments thereof should not be construed as to limiting the technical scope of the present invention. Accordingly, any variations, combinations and sub-combinations of the present preferred embodiments should be permitted without departing from the technical scope of the invention.

What is claimed is:

1. A semiconductor manufacturing apparatus for forming a semiconductor circuit on a semiconductor wafer while performing semiconductor manufacturing process on said semiconductor wafer, said apparatus comprising a plurality of stations including:

a wafer mounting section where a plurality of semiconductor wafers can be introduced into said apparatus and mounted therein;

a process chamber where a manufacturing process is performed on said semiconductor wafers;

a wafer service section where semiconductor wafers can be introduced into and removed from said apparatus; and a conveying section including a conveying apparatus suitably configured to convey semiconductor wafers between the stations, wherein, the apparatus is operatively configured and programmed to convey said plurality of semiconductor wafers to said process chamber as a group;

the apparatus is operatively configured and programmed to select at least one semiconductor wafer in said process chamber from among those of said plurality of semiconductor wafers for which the manufacturing process has been completed and then to remove said semiconductor wafer from the process chamber and to convey said semiconductor wafer to the wafer service section, and the apparatus is operatively configured and programmed to convey said semiconductor wafer from the wafer service section to the wafer mounting section and to rejoin said semiconductor wafer with those other semiconductor wafers for which the manufacturing process in the process chamber has been completed.

2. The semiconductor manufacturing apparatus according to claim 1, further comprising:

storage means for storing an identification code for each semiconductor wafer selected from said process chamber, wherein, said apparatus is operatively configured and programmed to return each selected semiconductor wafer to its original position on said wafer mounting section, based on its identification code stored in said storage means.

3. The semiconductor manufacturing apparatus according to claim 2, wherein said semiconductor wafers are mounted on said wafer mounting section by way of a container containing a plurality of semiconductor wafers.

4. The semiconductor manufacturing apparatus according to claim 3, wherein said identification code includes an address code identifying a location within said container from whence each selected semiconductor wafer is removed prior to conveying to the wafer service section.

5. The semiconductor manufacturing apparatus according to claim 4, wherein said identification code includes an address code identifying a container if a plurality of containers are used in the in conveying of the semiconductor wafers from the wafer mounting section to the process chamber.

6. The semiconductor manufacturing apparatus according to claim 5, wherein said apparatus is operatively configured and programmed to remove an entire container of semiconductor wafers from among those semiconductor wafers having finished said semiconductor manufacturing process in said process chamber and to convey said entire container of semiconductor wafers to said wafer service section.

7. The semiconductor manufacturing apparatus of claim 1 further comprising signaling device, wherein said apparatus is operatively configured and programmed to signal the availability of a semiconductor wafer for removal from said wafer service section.

8. The semiconductor manufacturing apparatus of claim 1 further comprising a second wafer mounting section where a plurality of semiconductor wafers can be introduced into said apparatus and mounted therein.

9. The semiconductor manufacturing apparatus of claim 1 further comprising a second process chamber where a manufacturing process is performed on said semiconductor wafers.

10. The semiconductor manufacturing apparatus of claim 9 further comprising a second wafer mounting section where a plurality of semiconductor wafers can be introduced into said apparatus and mounted therein.

* * * * *